United States Patent
Jeon

Patent Number: 5,872,377
Date of Patent: Feb. 16, 1999

[54] POWER SEMICONDUCTOR DEVICES HAVING HIGHLY INTEGRATED UNIT CELLS THEREIN

[75] Inventor: Chang-Ki Jeon, Kyungki-do, Rep. of Korea

[73] Assignee: Samsung Electronics Co., Ltd., Suwon, Rep. of Korea

[21] Appl. No.: 730,792

[22] Filed: Oct. 16, 1996

[30] Foreign Application Priority Data

Oct. 16, 1995 [KR] Rep. of Korea .................. 1995 35598

[51] Int. Cl.⁶ .............................. H01C 29/74; H01L 29/76
[52] U.S. Cl. .......................... 257/341; 257/139; 257/401
[58] Field of Search ................................... 257/330, 331, 257/332, 337, 139, 147, 341, 401

[56] References Cited

U.S. PATENT DOCUMENTS

| | | | |
|---|---|---|---|
| 4,961,100 | 10/1990 | Baliga et al. ................................ | 357/39 |
| 4,994,871 | 2/1991 | Chang et al. ............................. | 257/331 |
| 5,136,349 | 8/1992 | Yilmaz et al. ............................ | 257/335 |
| 5,177,572 | 1/1993 | Murakami ................................ | 257/331 |
| 5,242,845 | 9/1993 | Baba et al. ................................ | 437/40 |
| 5,282,018 | 1/1994 | Hiraki et al. ............................. | 257/296 |
| 5,323,040 | 6/1994 | Baliga ...................................... | 257/332 |
| 5,329,142 | 7/1994 | Kitagawa et al. ....................... | 257/139 |
| 5,525,821 | 6/1996 | Harada et al. ........................... | 257/331 |

Primary Examiner—Wael Fahmy
Attorney, Agent, or Firm—Myers Bigel Sibley & Sajovec

[57] ABSTRACT

An insulated gate power semiconductor device includes an array of base contact openings in a continuous source region at a face of a semiconductor substrate, and an array of trenches therein. The trenches are preferably interspersed among the array of base contact openings to maximize the effective channel width of the inversion layer channels which are formed in a base region during forward conduction. The device contains a drift region of first conductivity type therein as well as a base region of second conductivity type which extends between the drift region and the first face. In addition, a continuous source region of first conductivity type is provided which extends from the base region to the first face. The source region also has a two-dimensional array of base contact openings therein through which the base region extends. To improve the forward current carrying capability, first and second pairs of opposing trenches are provided in the substrate, on opposites sides of each of the base contact openings in the array, and an insulated gate electrode is also provided in each of the first and second pairs of opposing trenches. To further improve the current carrying capability of the device, the trenches are preferably formed to have a large effective sidewall area (relative to a given lateral dimension) by increasing the number of sidewalls for each trench to twenty-eight (28).

10 Claims, 3 Drawing Sheets

POWER SEMICONDUCTOR DEVICES HAVING HIGHLY INTEGRATED UNIT CELLS THEREIN

FIELD OF THE INVENTION

The present invention relates to semiconductor devices, and more particularly to insulated gate power semiconductor devices and methods of forming same.

BACKGROUND OF THE INVENTION

A critical parameter in the design of insulated gate power semiconductor devices such as insulated gate field effect transistors (e.g., MOSFETs) and insulated gate bipolar transistors (IGBTs) is the forward on-state resistance because it determines the maximum current carrying capability of the device. With respect to power MOSFETs, the on-state resistance is the total resistance between the source and drain terminals during forward conduction. This total resistance can be determined by summing the resistance contributions of the MOSFET's source region, channel region, drift region and drain/substrate region. Determination of the total resistance for DMOS-type power MOSFETs is more fully described and illustrated in section 7.4.4 of a textbook by B. J. Baliga entitled *Power Semiconductor Devices*, PWS Publishing Co. (ISBN 0-534-94098-6) (1995).

However, while it may be advantageous to reduce the resistance of each of these regions to minimize forward on-state resistance, the resistance of the drift region generally cannot be minimized without significantly reducing the breakdown voltage of the device. As shown in FIGS. 1A through 1C, a conventional trench DMOS transistor has a body layer 4 which is formed on a main surface of a semiconductor substrate 1 and doped with a p type impurity, a trench which is formed passing through the body layer 4, a gate oxide layer 2 which is formed on the sidewalls and the bottom of the trench, a gate polysilicon layer 3 which is formed on the gate oxide layer 2 and filled in the trench, and two source contact regions 5 which are formed on both upper sides of the gate polysilicon layer 3 and doped with an $n^+$ type impurity.

In such a trench DMOS transistor, a drain electrode is connected to the back surface of the semiconductor substrate 1, and a source electrode is commonly connected to the two source contact regions 5 and the body layer 4, and a gate electrode is connected to the gate polysilicon layer 3 which is filled in the trench. The semiconductor substrate 1 consists of an $n^+$ type drain region 1a doped with a high concentration impurity and an n type drift region 1b doped with a low concentration impurity.

When a voltage signal is applied to said trench DMOS transistor, two channels 6a and 6b are vertically formed along the side surfaces of the gate oxide layer 3, as shown in FIG. 1C, between the source contact regions 5 and the drift region 1b. Because the conventional trench DMOS transistor includes on trench, a current signal flows through only two channels which are formed along both sidewalls of the trench. Moreover, because the area occupied by two channels in the conventional transistor is relatively small as compared to the area occupied by the source contact regions 5 and the body layer 4 under a source electrode, the amount of current flowing through the channels is typically insufficient to provide large current carrying capability. The conventional trench DMOS transistor has another problem in that the gate contact area is typically limited due to the structure of the unit cells which, as illustrated in FIG. 1A, are electrically connected by the gate polysilicon layer 3, and a portion 3a of the gate polysilicon layer surrounded by four cells is not wider in area than the other portion 3b.

Thus, notwithstanding the above described insulated gate semiconductor devices including power MOSFETs and IGBTs, there continues to be a need for devices which have both high current carrying capability and high breakdown voltages.

SUMMARY OF THE INVENTION

It is therefore an object of the present invention to provide improved insulated gate semiconductor devices for high power applications, and methods of forming same.

It is another object of the present invention to provide insulated gate semiconductor devices having high current carrying capability and high breakdown voltages, and methods of forming same.

These and other objects, features and advantages of the present invention are provided by insulated gate power semiconductor devices, such as vertical power MOSFETs and IGBTs, having a unit cell structure which simultaneously provides for high forward current carrying capability and high breakdown voltage capability, and methods of forming same. According to one embodiment, a multicellular vertical power semiconductor device is provided having an array of base contact openings in a continuous source region at a face of a semiconductor substrate, and an array of trenches therein which are preferably interspersed among the array of base contact openings to maximize the effective channel width of the inversion layer channels which are formed in a base region during forward conduction. According to this embodiment, a multicellular power semiconductor device is provided in a semiconductor substrate having first and second opposing faces. The device contains a drift region of first conductivity type therein as well as a base region of second conductivity type which extends between the drift region and the first face. In addition, a continuous source region of first conductivity type is provided which extends from the base region to the first face. The source region also has a two-dimensional array of base contact openings therein through which the base region extends. To improve the forward current carrying capability, first and second pairs of opposing trenches are provided in the substrate, on opposites sides of each of the base contact openings in the array, and an insulated gate electrode is also provided in each of the first and second pairs of opposing trenches. To further improve the current carrying capability of the device, the trenches are preferably formed to have a large effective sidewall area (relative to a given lateral dimension) by increasing the number of sidewalls for each trench to twenty-eight (28).

BRIEF DESCRIPTION OF THE DRAWINGS

FIG. 1 shows the structure of a conventional trench DMOS transistor, wherein

FIG. 2 shows the structure of a trench DMOS transistor according to an embodiment of the present invention, wherein

DETAILED DESCRIPTION OF PREFERRED EMBODIMENTS

Figure 1A:
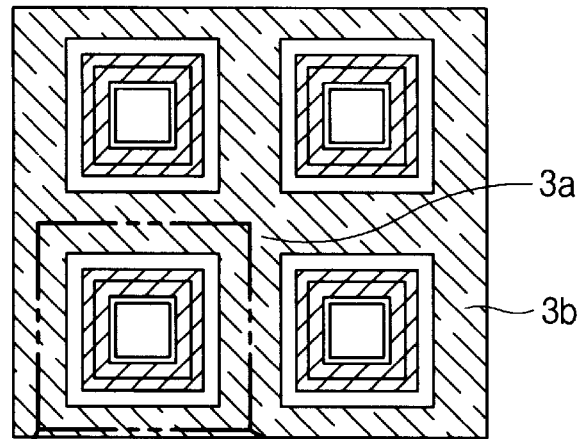
FIG. 1A is a plan view of the DMOS transistor.
Figure 1B:
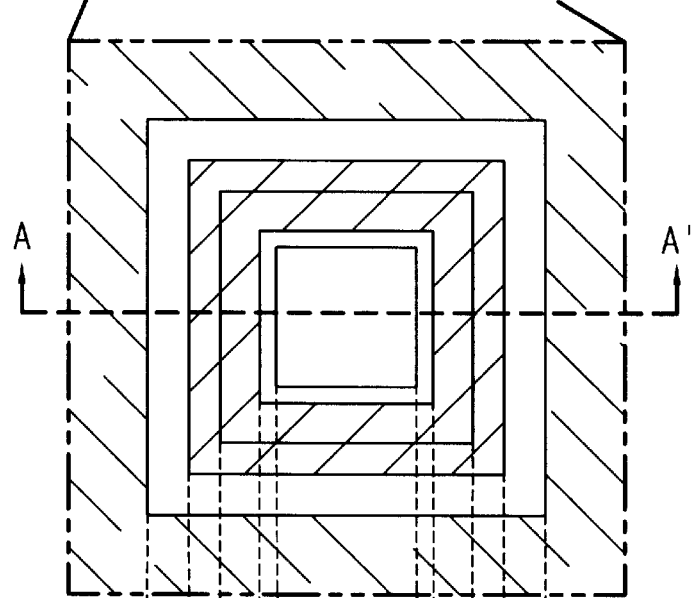
FIG. 1B is an enlarged plan view illustrating a part of the DMOS transistor shown in FIG. 1A.
Figure 1C:
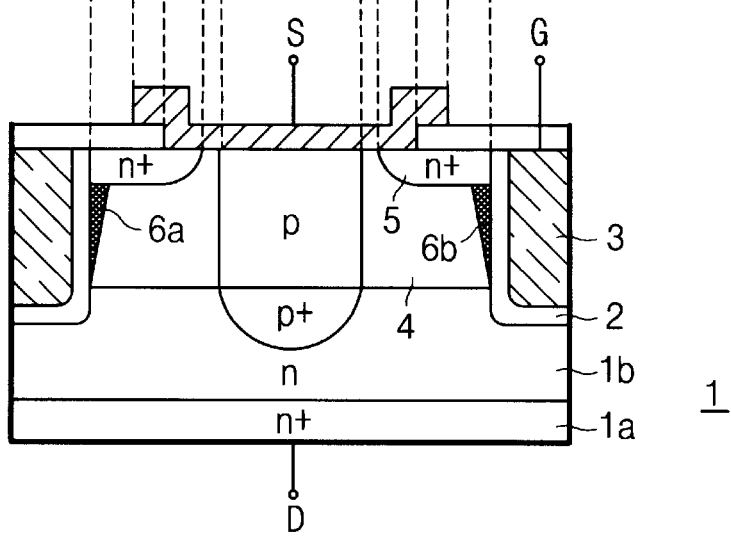
FIG. 1C is cross-sectional view taken along a line A–A' of FIG. 1B.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Moreover, the terms "first conductivity type" and "second conductivity type" refer to opposite conductivity types such as N or P-type, however, each embodiment described and illustrated herein includes its complementary embodiment as well.

Figure 2A:
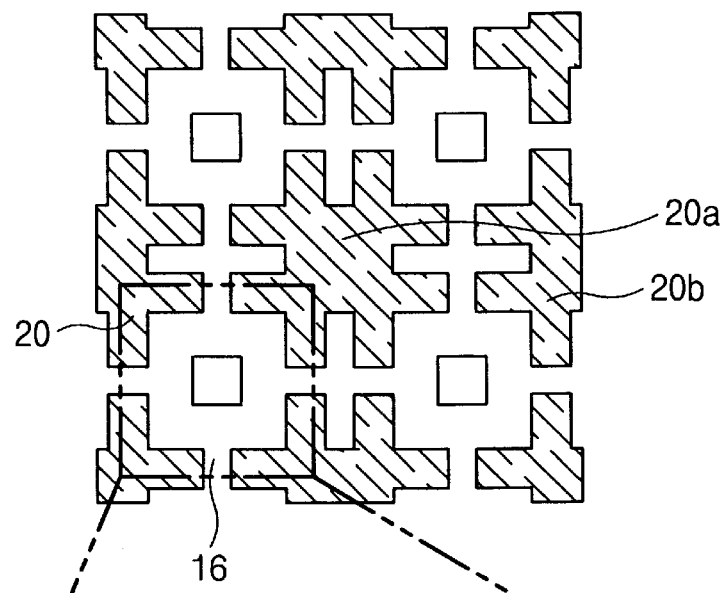
FIG. 2A is a plan view of the DMOS transistor.
Figure 2B:
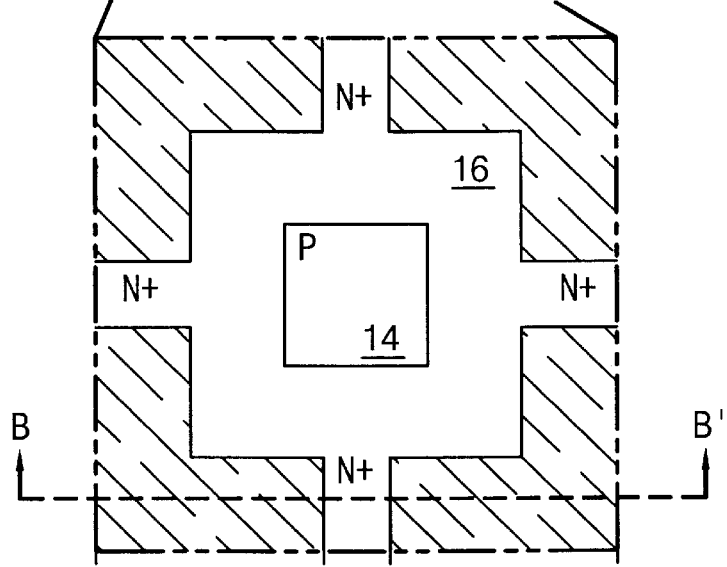
FIG. 2B is an enlarged plan view illustrating a part of the DMOS transistor shown in FIG. 2A.
Figure 2C:
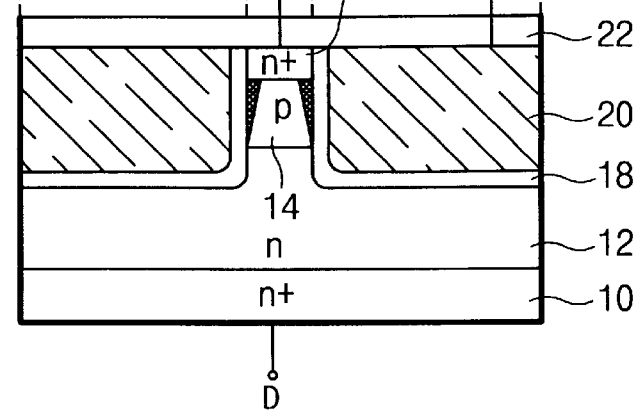
FIG. 2C is a cross-sectional view taken along a line B–B' of FIG. 2B.

Referring now to FIG. 2C, the novel trench DMOS device in accordance with the present invention has a single source contact region of first conductivity type 16 which is formed over a base layer of second conductivity type 14. As described hereinbelow, the area occupied by the inversion-layer channels is relatively wide compared to the area occupied by the base layer 14, so that the device has a high current carrying capability.

As shown again in FIG. 2C, a semiconductor substrate is composed of an $n^+$ type semiconductor drain region 10 which is doped with an impurity having high concentration and an n type semiconductor drift region 12 which is formed on the $n^+$ type semiconductor region 10 and doped with the identical impurity of lower concentration. The $n^+$ type drain region 10 is provided to be electrically connected with a drain electrode. On the n type semiconductor drift region 12, a p type diffused layer 14 serving as a base layer is formed. Also, a plurality of trenches are separately formed extending vertically downward through the diffused layer to an upper portion of the semiconductor drift region 12. Each of the trenches has multiple sidewalls (e.g., 28) and a bottom. By oxidation, a gate oxide layer 18 is formed on the sidewalls and the bottoms of each trench. Polysilicon is filled into each trench to form a gate polysilicon layer 20. The oxide layer 18 and polysilicon layer 20 collectively form an insulated gate electrode. In order to electrically connect multiple cells (i.e., adjacent transistors) to each other, an $n^+$ impurity source layer 16 is formed on the p type diffused base layer 14 and between the gate polysilicon layers 20 adjacent to each. The $n^+$ impurity source layer 16 is in contact with a source electrode.

With reference to FIG. 2A, in the trench DMOS device of the present invention, cells are electrically connected with one another by the $n^+$ impurity source layer 16 and a portion 20a of the gate polysilicon layers 20 surrounded by the cells are formed wider than the other portion 20b. Accordingly, a gate contact can be easily formed on the relatively wide portion 20a without any restriction.

Next, a method of fabricating the trench DMOS transistor having the above described structure will be described with reference to FIGS. 3A through 3D. In FIGS. 3A through 3D, the same components as those in FIG. 2 are indicated by the same reference numerals to omit redundant description.

Figure 3A:
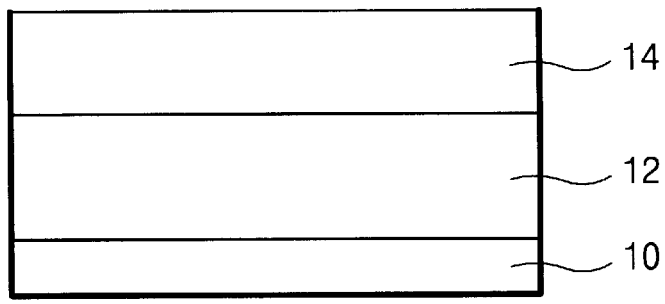
FIGS. 3A through 3D are schematic cross-sectional views of intermediate structures illustrating a method of forming a trench DMOS transistor according to a first embodiment of the present invention.

Referring to FIG. 3A, on an $n^+$ type semiconductor drain layer 10 doped with a high concentration impurity, an n type semiconductor drift layer 12 is formed on the $n^+$ type semiconductor layer 10 and doped with a low concentration impurity to form a covering layer. Next, an impurity diffusion process to the top surface of the semiconductor substrate is performed to form a diffused layer 14 on the n type semiconductor drift layer 12. The diffused layer 14 is used as a base layer of the trench DMOS transistor.

Figure 3B:
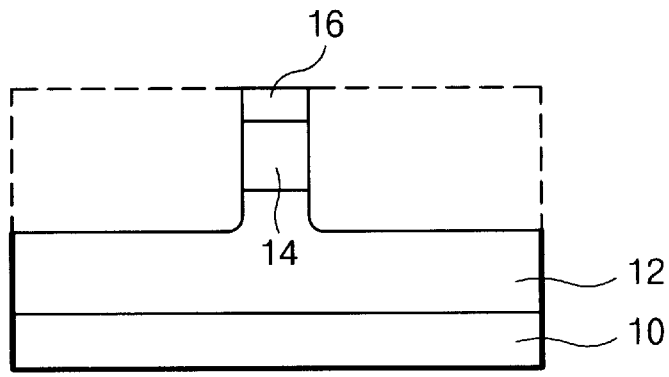

After forming a patterned dielectric layer (not shown) on the diffused layer 14, an ion injecting process to the diffused layer 14 is performed by using the patterned dielectric layer as a source forming mask, to form a source contact region 16 on the diffused layer 14, as shown in FIG. 3B. The source contact region 16 is doped with a high concentration impurity of $n^+$ type and the patterned dielectric layer is made of silicon dioxide (e.g., $SiO_2$).

Figure 3C:
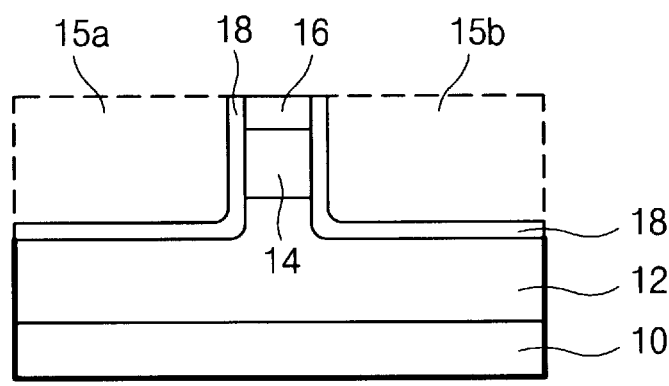

Subsequently, after removing the patterned dielectric layer, a patterned silicon dioxide layer (not shown) is again formed on the diffused layer 14 to define a plurality of trench regions. Using the patterned silicon dioxide layer as a trench forming mask, an etching process is performed to form multiple trenches 15a, 15b each having sidewalls and bottoms. The etching process may be a reactive ion beam etching (RIE) process or the like. Also, each of the trenches 15a, 15b extends vertically downward through the diffused layer, as shown in FIG. 3C. Oxidation then is performed to form a gate oxide layer 18 on the sidewalls and bottoms of the trenches, as shown in FIG. 3C. The remaining $n^+$ type impurity injection layer 16, which is formed on the diffused layer 14 and between the two trenches 15a and 15b, is used as a source contact region to be in contact with a source electrode.

Figure 3D:
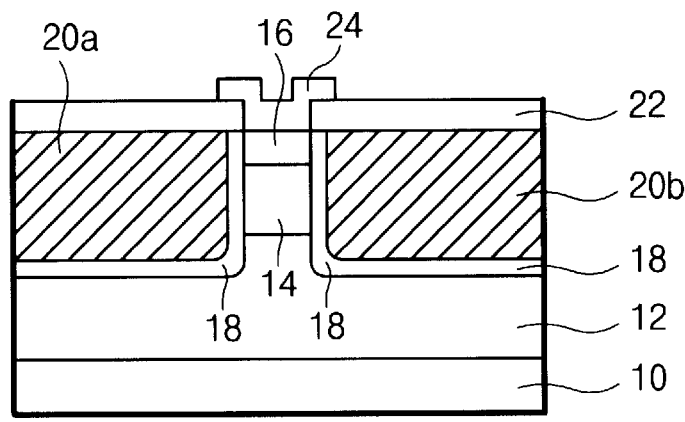

Also, as shown in FIG. 3D, polysilicon is formed on the gate oxide layer 18, being filled in the respective trenches 15a and 15b, so that two polysilicon layers 20a and 20b are formed in the trenches 15a and 15b.

Finally, by metallization a gate electrode is electrically connected to the gate polysilicon layer 20, a source electrode 24 (indicated by a reference numeral 24 in FIG. 3D) to the $n^+$ type impurity injection layer 16 and a drain electrode to the back surface of the semiconductor substrate.

As described above, in the trench DMOS transistor of the present invention, as shown in FIG. 2C, the area occupied by the channels formed at the sidewalls of the gate polysilicon layer 20 is relatively wide as compared with the area occupied by the source contact region 16 and the base layer 14 (or the diffused layer) under the source electrode 24, so that the transistor may have a large current carrying capability.

In addition, because the portion of the gate polysilicon layers surrounded by the cells is wider than the other portion, a gate contact region may be easily formed.

Furthermore, because source contact regions of cells are electrically connected by only a single source electrode, the fabricating process of such a device can be simplified as compared with that of a conventional device in which source contact regions of cells are electrically connected by separate source electrodes.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

That which is claimed is:

1. A power semiconductor device comprising:

a semiconductor substrate having first and second opposing faces and containing a drift region of first conductivity type therein;

a base region of second conductivity type in said substrate, said base region extending between said drift region and the first face;

a source region of first conductivity type in said substrate, said source region extending from said base region to the first face and having a base contact opening therein through which said base region extends;

first and second pairs of opposing trenches in said substrate and on opposite sides of the base contact opening, each of said first and second pairs of opposing trenches having twenty eight sidewalls; and an insulated gate electrode in each of said first and second pairs of opposing trenches.

2. The power semiconductor device of claim 1, wherein said first and second pairs of opposing trenches are spaced from each other at the first face by said source region.

3. The power semiconductor device of claim 2, wherein the trenches in said first pair are spaced from each other at the first face by said source region and wherein the trenches in said second pair are spaced from each other at the first face by said source region.

4. The power semiconductor device of claim 2, wherein a perimeter of each of said first and second pairs of opposing trenches at the first face defines an interface between said source region and a respective insulated gate electrode therein.

5. The power semiconductor device of claim 4, wherein said base contact opening is rectangular in shape; and wherein each of the trenches in said first and second pairs of trenches have at least two sidewalls which extend opposite two corresponding sides of the base contact opening.

6. The power semiconductor device of claim 1, wherein said base region forms a P-N junction with said source region along an entire perimeter of the base contact opening.

7. A power semiconductor device comprising:

a semiconductor substrate having first and second opposing faces and containing a drift region of first conductivity type therein;

a base region of second conductivity type in said substrate, said base region extending between said drift region and the first face;

a source region of first conductivity type in said substrate, said source region extending from said base region to the first face and having a two-dimensional array of base contact openings therein through which said base region extends;

first and second pairs of opposing trenches in said substrate, each of said first and second pairs of opposing trenches having twenty eight sidewalls and extending between a plurality of base contact openings; and an insulated gate electrode in each of said first and second pairs of opposing trenches.

8. The power semiconductor device of claim 7, wherein each of said first pairs of opposing trenches extends opposite at least two base contact openings and is separated therefrom at the first face by said source region.

9. A power semiconductor device, comprising:

a semiconductor substrate having first and second opposing faces and containing a drift region of first conductivity type therein;

a base region of second conductivity type in said substrate, said base region extending between said drift region and the first face;

a source region of first conductivity type in said substrate, said source region extending from said base region to the first face and having a base contact opening therein through which said base region extends;

first and second pairs of opposing trenches in said substrate at the first face and on opposite sides of the base contact opening, said first and second pairs of opposing trenches each having twenty eight sidewalls; and an insulated gate electrode in each of said first and second pairs of opposing trenches.

10. The power semiconductor device of claim 9, wherein said base region forms a P-N junction with said source region along an entire perimeter of the base contact opening.

* * * * *